(12) United States Patent
Su et al.

(10) Patent No.: US 10,249,573 B2
(45) Date of Patent: Apr. 2, 2019

(54) SEMICONDUCTOR DEVICE PACKAGE WITH A STRESS RELAX PATTERN

(71) Applicant: POWERTECH TECHNOLOGY INC., Hsinchu County (TW)

(72) Inventors: Ting-Feng Su, Hsinchu County (TW); Chia-Jen Chou, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 15/461,465

(22) Filed: Mar. 16, 2017

(65) Prior Publication Data

US 2018/0269160 A1 Sep. 20, 2018

(51) Int. Cl.

| H01L 23/00 | (2006.01) |
|---|---|
| H01L 23/538 | (2006.01) |
| H01L 21/56 | (2006.01) |
| H01L 21/48 | (2006.01) |
| H01L 23/373 | (2006.01) |
| H01L 23/31 | (2006.01) |

(52) U.S. Cl.
CPC ........ *H01L 23/562* (2013.01); *H01L 21/4853* (2013.01); *H01L 21/4857* (2013.01); *H01L 21/563* (2013.01); *H01L 21/565* (2013.01); *H01L 21/568* (2013.01); *H01L 23/315* (2013.01); *H01L 23/3114* (2013.01); *H01L 23/3737* (2013.01); *H01L 23/5383* (2013.01); *H01L 23/5386* (2013.01); *H01L 21/561* (2013.01); *H01L 23/3128* (2013.01)

(58) Field of Classification Search
CPC ... H01L 21/561; H01L 21/563; H01L 23/562; H01L 21/565; H01L 21/568; H01L 23/3114; H01L 23/3737; H01L 23/315
See application file for complete search history.

(56) References Cited

U.S. PATENT DOCUMENTS

| 5,450,283 | A | * | 9/1995 | Lin | ............... | H01L 21/563 |
|---|---|---|---|---|---|---|
| | | | | | | 174/16.3 |
| 7,071,576 | B2 | | 7/2006 | Nakayoshi | | |
| 7,148,560 | B2 | | 12/2006 | Lee | | |
| 7,453,148 | B2 | | 11/2008 | Yang | | |
| 8,034,661 | B2 | | 10/2011 | Lin | | |
| 9,478,504 | B1 | * | 10/2016 | Shen | ............... | H01L 23/49838 |
| 2006/0292750 | A1 | * | 12/2006 | James | ............... | H01L 21/561 |
| | | | | | | 438/118 |

(Continued)

FOREIGN PATENT DOCUMENTS

| CN | 101207099 A | 6/2008 |
|---|---|---|
| CN | 102082102 B | 9/2015 |

*Primary Examiner* — Feifei Yeung Lopez
(74) *Attorney, Agent, or Firm* — Winston Hsu

(57) ABSTRACT

A semiconductor device package has a die, a pattern of dielectric material formed on an active surface of the die, a plurality of metal contacts electrically connected to the die and surrounded by the pattern, a mold compound formed around the pattern, the die and the metal contacts, and a redistribution layer formed on a grinded surface of the mold compound and electrically connected to the metal contacts. The dielectric material has a young's modulus lower than a young's modulus of the mold compound, and the dielectric material has a coefficient of thermal expansion lower than a coefficient of thermal expansion of the mold compound.

18 Claims, 12 Drawing Sheets

(56) References Cited

U.S. PATENT DOCUMENTS

| | | | | |
|---|---|---|---|---|
| 2012/0068353 A1* | 3/2012 | Huang | ............... | H01L 21/561 257/774 |
| 2012/0126395 A1* | 5/2012 | Lee | ............... | H01L 21/561 257/737 |
| 2013/0154116 A1* | 6/2013 | Choi | ............... | H01L 23/49816 257/777 |

* cited by examiner

SEMICONDUCTOR DEVICE PACKAGE WITH A STRESS RELAX PATTERN

BACKGROUND OF THE INVENTION

1. Field of the Invention

The present invention relates to packaging a semiconductor device package, and more particularly to a semiconductor device package with a pattern of dielectric material to reduce stress thereon.

2. Description of the Prior Art

Wafer level packaging process is known in the art. In a wafer level packaging process, a wafer with integrated circuits mounted thereon undergoes a series process, such as grinding, die-bonding, molding and so on, and is finally cut into finished products. Wafer level packaging process has been considered as suitable technology for small sized and high-speed package.

In wafer level packaging, the wafer and the dies mounted on the wafer are typically covered with a relatively thick layer of the molding compound. The thick layer of the molding compound results in increased warping of the packaging due to coefficient of thermal expansion (CTE) mismatch, and the thickness of the packaging. It is known that wafer warpage continues to be a concern.

SUMMARY OF THE INVENTION

An embodiment of the present invention provides a method of forming a semiconductor device package. The method comprises disposing a die on a carrier; forming a pattern of dielectric material on an active surface of the die to surround a plurality of metal contacts electrically connected to the die; forming a mold compound around the die, the metal contacts and the pattern; grinding the mold compound to expose the metal contacts; removing the carrier; and forming a redistribution layer on a grinded surface of the mold compound to electrically connect to the metal contacts. The dielectric material has a young's modulus lower than a young's modulus of the mold compound, and the dielectric material has a coefficient of thermal expansion lower than a coefficient of thermal expansion of the mold compound Another embodiment of the present invention provides a semiconductor device package. The semiconductor device package comprises a die, a plurality of metal contacts, a pattern of dielectric material, a mold compound, and a redistribution layer. The metal contacts electrically connected to the die. The pattern of the dielectric material is formed on an active surface of the die, and the metal contacts are surrounded by the pattern. The mold compound is formed around the pattern, the die and the metal contacts. The redistribution layer is formed on a grinded surface of the mold compound and electrically connected to the metal contacts. The dielectric material has a young's modulus lower than a young's modulus of the mold compound, and the dielectric material has a coefficient of thermal expansion lower than a coefficient of thermal expansion of the mold compound.

These and other objectives of the present invention will no doubt become obvious to those of ordinary skill in the art after reading the following detailed description of the preferred embodiment that is illustrated in the various figures and drawings.

DETAILED DESCRIPTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
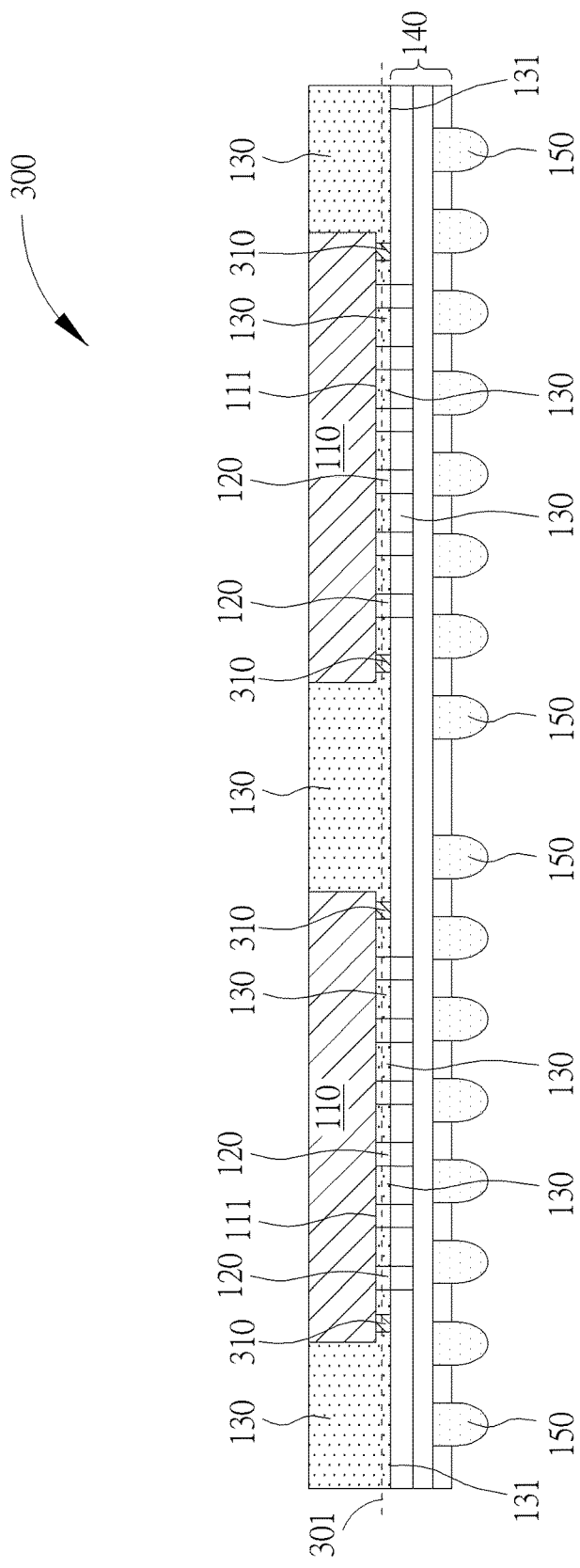
FIG. 1 is a cross-sectional diagram of a fan-out wafer level package (FOWLP) according to a first embodiment of the present invention.
Figure 2:
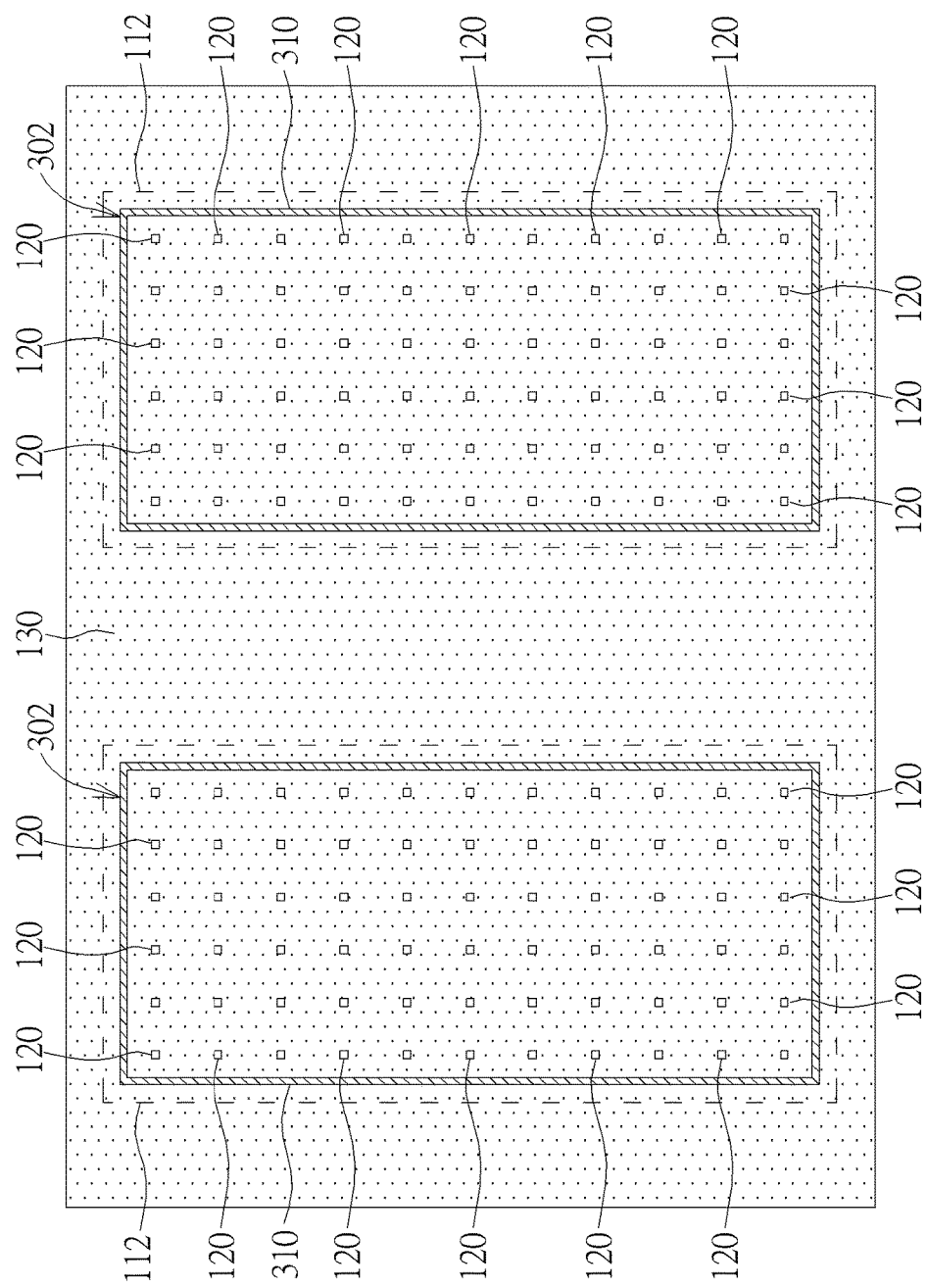
FIG. 2 is a planar view, corresponding to a dotted line 302 shown in FIG. 1, below an active surface of each die of the FOWLP.

FIG. 1 is a cross-sectional diagram of a fan-out wafer level package (FOWLP) 300 according to a first embodiment of the present invention. FIG. 2 is a planar view of an active surface 111 of each die 110 of the FOWLP 300 along a dotted line 301 shown in FIG. 1. The FOWLP 300 may include a plurality of dies 110, a plurality of metal contacts 120, a plurality of patterns 302 of dielectric material 310, an encapsulant 130, and at least a redistribution layer 140. Each die 110 has an outline represented by a die area 112 in FIG. 2. Each die 110 has metal contacts 120 formed on it. And, the metal contacts 120 may be electrically connected to the corresponding die 110. The metal contacts 120 may be formed through bumping, electroplating, or wire bonding, but is not limited to. Each die 110 may have a corresponding pattern 302 disposed on it. Each pattern 302 may be disposed on the active surface 111 of a die 110 and within the die area 112. The pattern 302 is formed to surround the metal contacts 120 of the die 110. The patterns 302 are used as a stress relax pattern for dispersing the stress induced on the peripheral portion of the active surface 111 of the corresponding die 110. In this way, the warpage of the die 110 can be suppressed. The pattern 302, the dies 110 and the metal contacts 120 are encapsulated by an encapsulant 130. The encapsulant 130 may have a grinded surface 131 where the redistribution layer 140 is formed. The redistribution layer 140 is electrically connected to the metal contacts 120. The dielectric material 310 used to form the pattern 302 has lower young's modulus than young's modulus of the encapsulant 130. Furthermore, dielectric material 310 has a lower coefficient of thermal expansion (CTE) than the encapsulant 130. The dielectric material 310 may have a young's modulus between 0.01 GPa and 5 GPa. The dielectric material 310 may be epoxy resin, silicon resin, polyimide resin, or a combination thereof. In an exemplary embodiment, the dielectric material 310 may be a b-stage adhesive.

The fan-out wafer level package (FOWLP) 300 is formed using the method as illustrated in FIG. 3 to FIG. 9 using a cross-sectional views. The method comprises a plurality of processing steps. Each of the processing steps is described with a corresponding diagram illustrated in FIG. 3 to FIG. 9.

Figure 3:
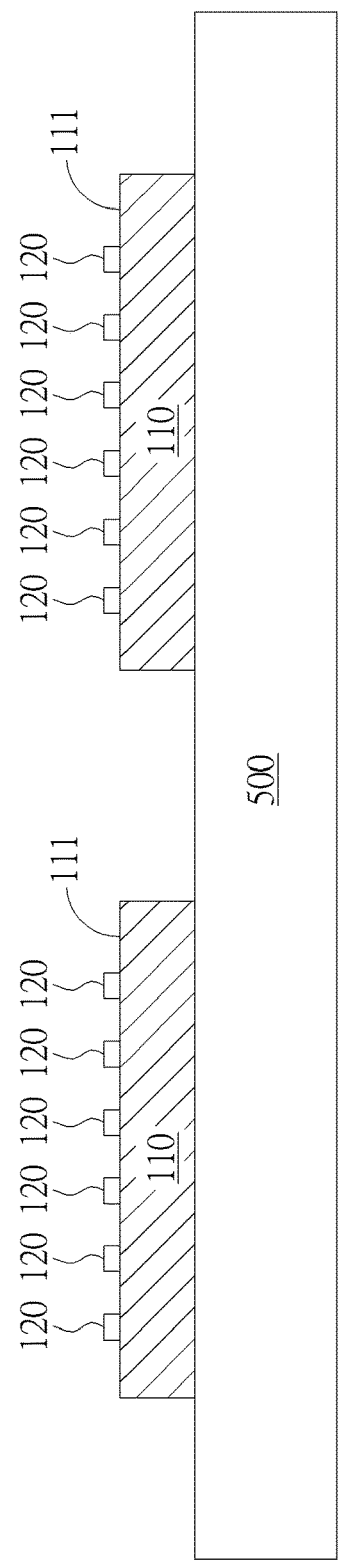
FIGS. 3 to 9 are component cross-sectional views showing each processing step of forming a semiconductor device package according to the first embodiment of the present invention.

As shown in FIG. 3, a plurality of dies 110 are temporarily disposed on a carrier 500. Each of the plurality of dies 110 have a plurality of metal contacts 120 formed on the active surface 111.

Figure 4:
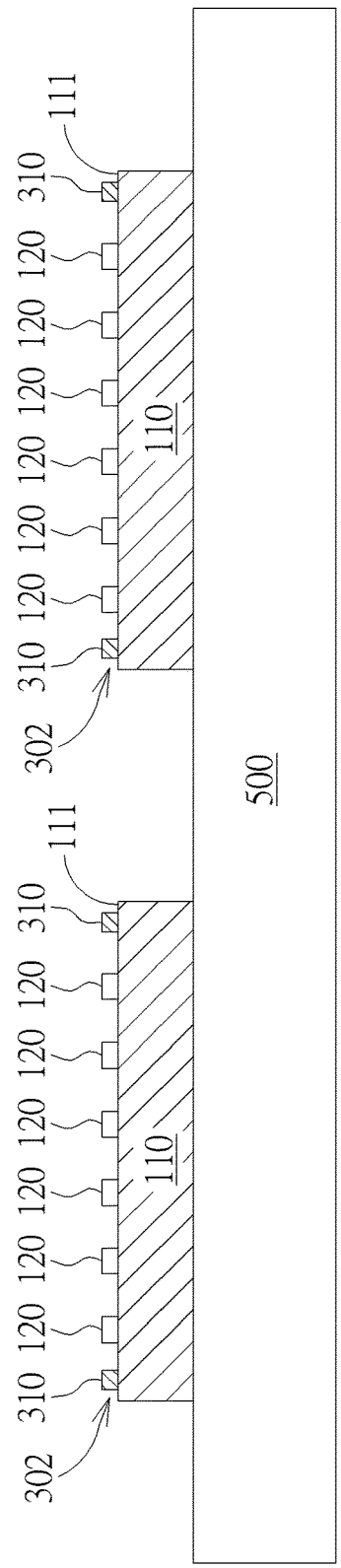

As shown in FIG. 4, a pattern 302 is formed on the active surface 111 of each die 110. The pattern 302 may be a dielectric material 310 formed on the active surface 111 using screen printing technique. However, the pattern 302 may also be formed using photolithography in some other embodiments. The pattern 302 may surround the metal contacts 120 of a corresponding die 110 as shown in FIG. 2. The pattern 302 may be formed on the corresponding die 110 before or after the die 110 is temporarily disposed on the carrier 500.

Figure 5:
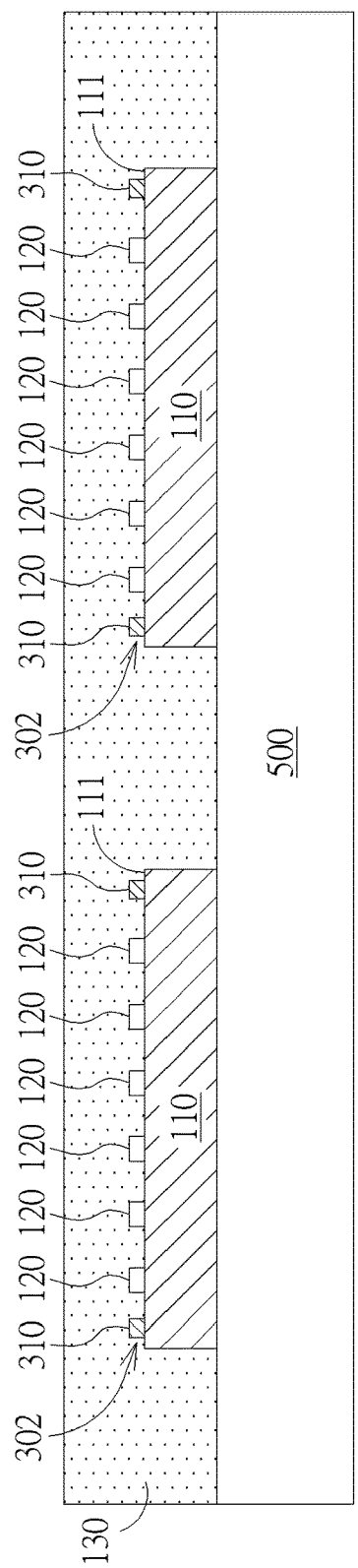

As shown in FIG. 5, an encapsulant 130 is formed to encapsulate the dies 110, the metal contacts 120 and the patterns 302. The encapsulant 130 may be formed using epoxy molding compound (EMC).

Figure 6:
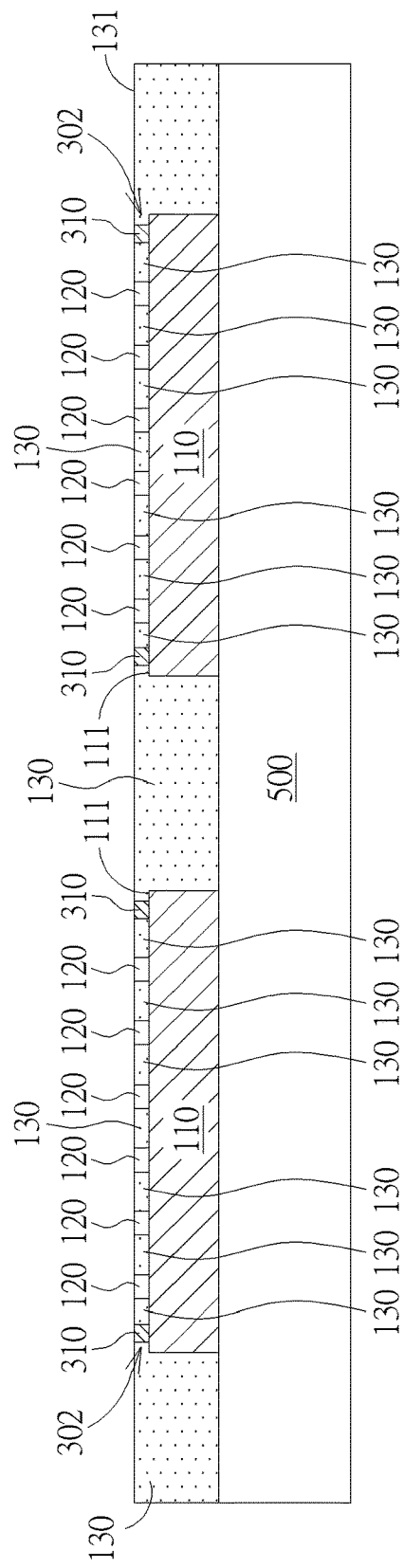

As shown in FIG. 6, the encapsulant 130 is grinded through grinding process to form a grinded surface 131. The grinding process may reduce the thickness of the encapsulant 130 and allow the grinded surface 131 to expose surfaces of the metal contacts 120 and the dielectric material 310.

Figure 7:
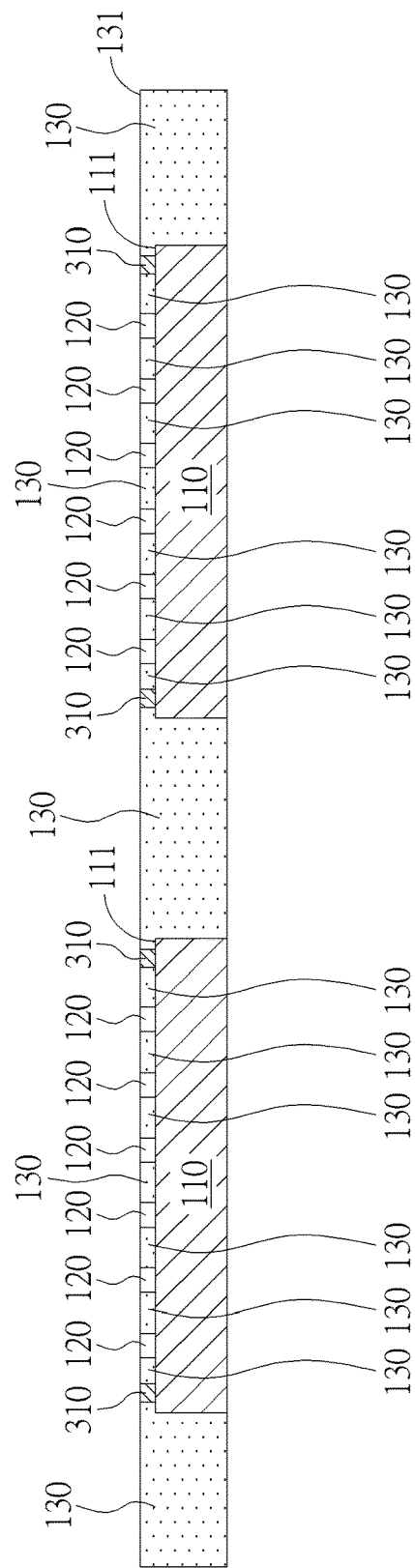

As shown in FIG. 7, the carrier 500 is removed.

Figure 8:
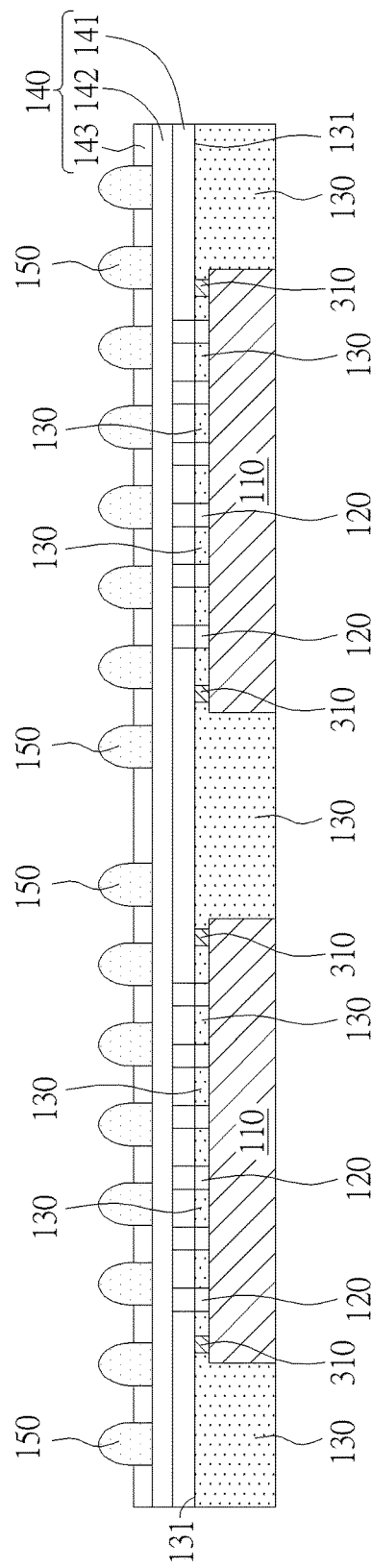

As shown in FIG. 8, the redistribution layer 140 is formed on the grinded surface 131 of the encapsulant 130. The redistribution layer 140 is electrically connected to the metal contacts 120. The redistribution layer 140 may comprise a first dielectric layer 141, a metal layer 142 and a second dielectric layer 143. The metal layer 142 may be formed between the first dielectric layer 141 and the second dielectric layer 143. The first dielectric layer 141 may be formed to have openings exposing a surface of the metal contacts 120. And, the openings of the first dielectric layer 141 are further filled with the conductive material used to form the metal layer 142 to form the electrical connection between the metal contacts 120 and the metal layer 142. The second dielectric layer 143 may be formed to have openings exposing at least one part of the metal layer 142. A plurality of solder balls 150 are formed on the openings of the second dielectric layer 143 to electrically connect solder balls 150 to the metal contacts 120 through the metal layer 142. The first dielectric layer 141 and the second dielectric layer 143 may be polyimide layers.

Figure 9:
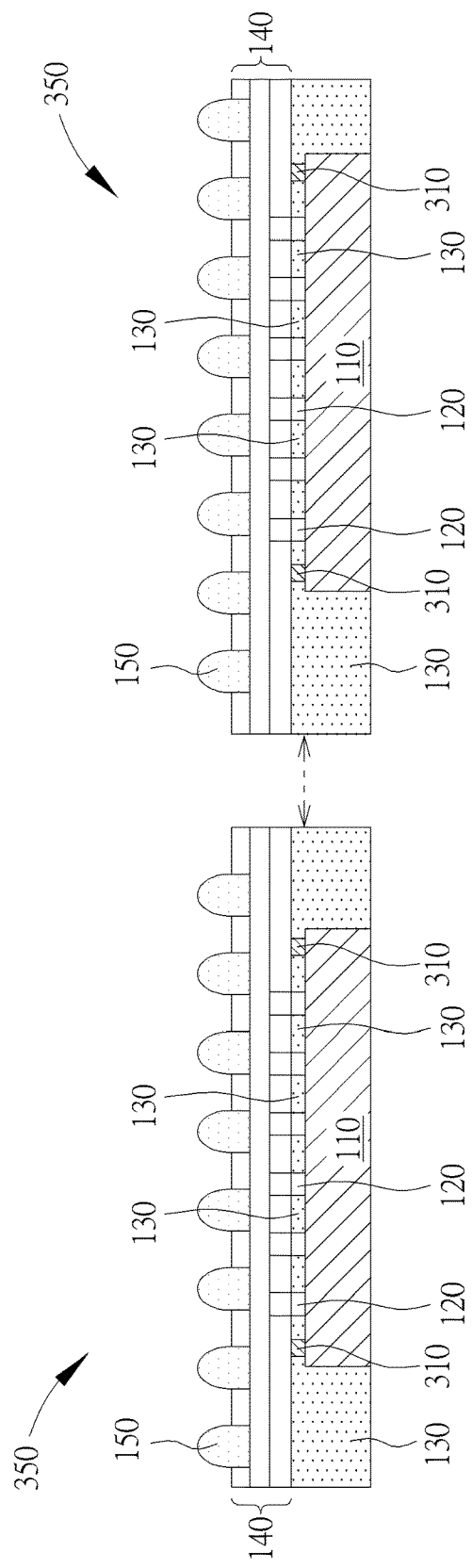

As shown in FIG. 9, after the formation of the wiring layer 140, the mold compound 130 and the wiring layer 140 are sawed by a sawing mechanism so as to manufacture a plurality of semiconductor device package 350. In the embodiment, each of the device packages 350 comprises at least one of the dies 110.

Figure 10:
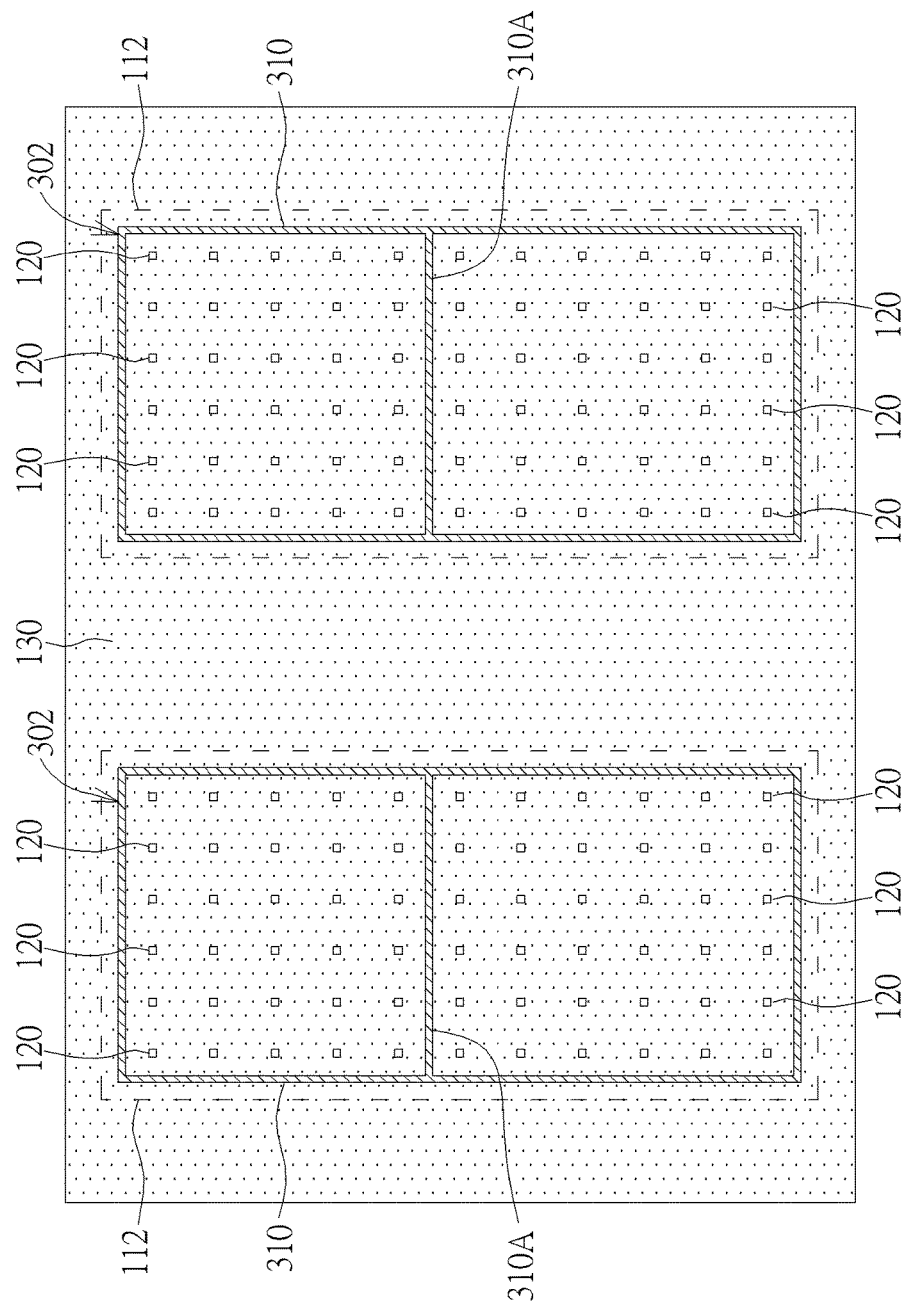
FIG. 10 is a planar view showing a different layout of the patterns of the dielectric material according to a second embodiment of the present invention.

FIG. 10 is a planar view showing a different layout of the patterns 302 of the dielectric material 310 according to a second embodiment of the present invention. In the embodiment, each of the patterns 302 further comprises an additional section 310A to form two openings of the pattern 302. A portion of the plurality of metal contacts 120 are formed within a first opening of the pattern 302. Another portion of the plurality of metal contacts 120 are formed within a second opening of the pattern 302. In addition, the additional section 310A may be formed to form two substantially equal sized openings. Thus, the number of metal contacts 120 within the openings may be equal to each other. In some other embodiment, there may be odd number of rows of metal contacts 120. In this case, one opening may be larger than the other opening. The spaces between the metal contacts 120 and the pattern 302 are filled with the mold compound 130.

Figure 11:
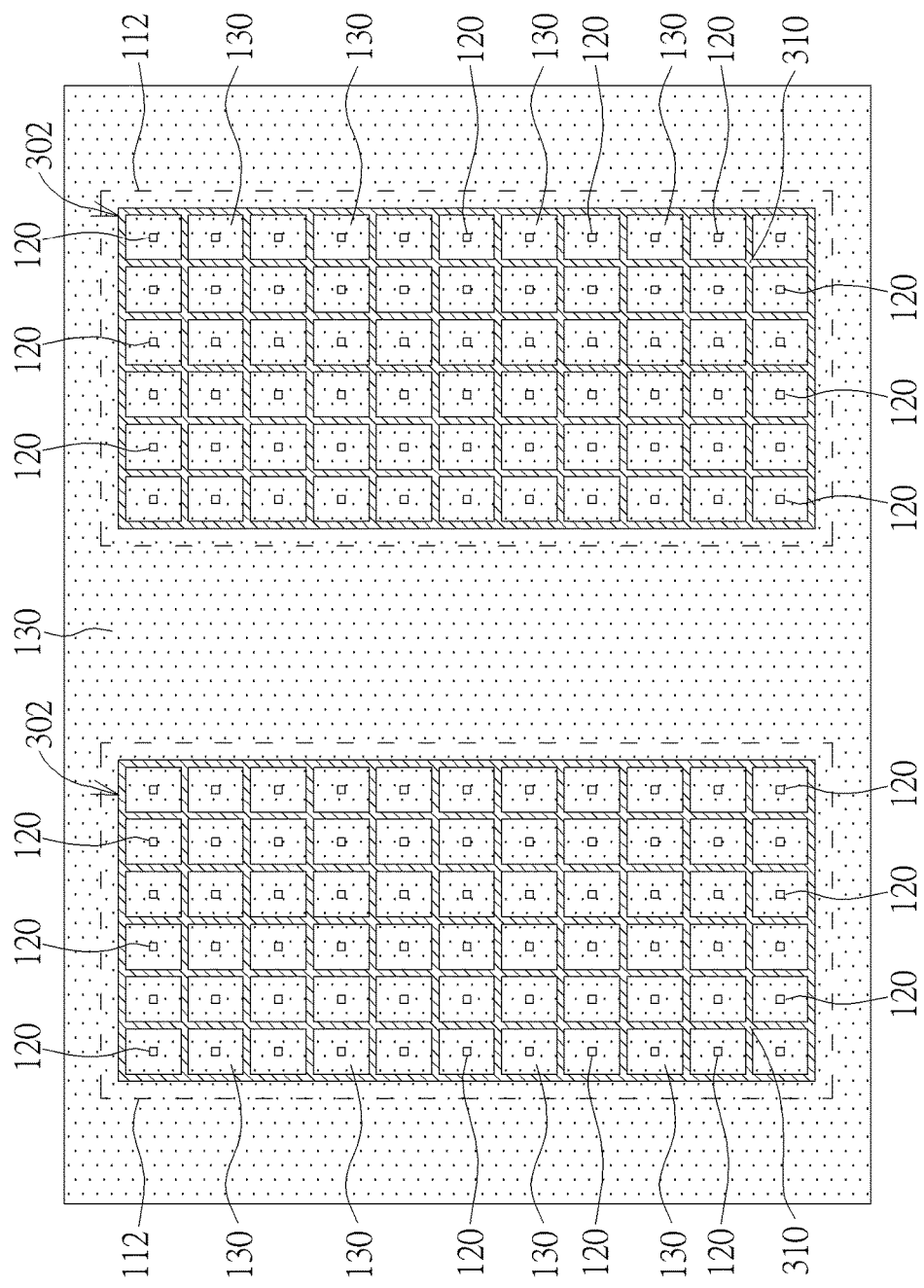
FIG. 11 is a planar view showing a different layout of the patterns of the dielectric material according to a third embodiment of the present invention.

FIG. 11 is a planar view showing a different layout of the patterns 302 of the dielectric material 310 according to a third embodiment of the present invention. In the embodiment, the pattern 302 comprises a plurality of openings. Each of the metal contacts 120 is formed within one of the openings of the pattern 302. The spaces between the metal contacts 120 and the pattern 302 are filled with the mold compound 130.

Figure 12:
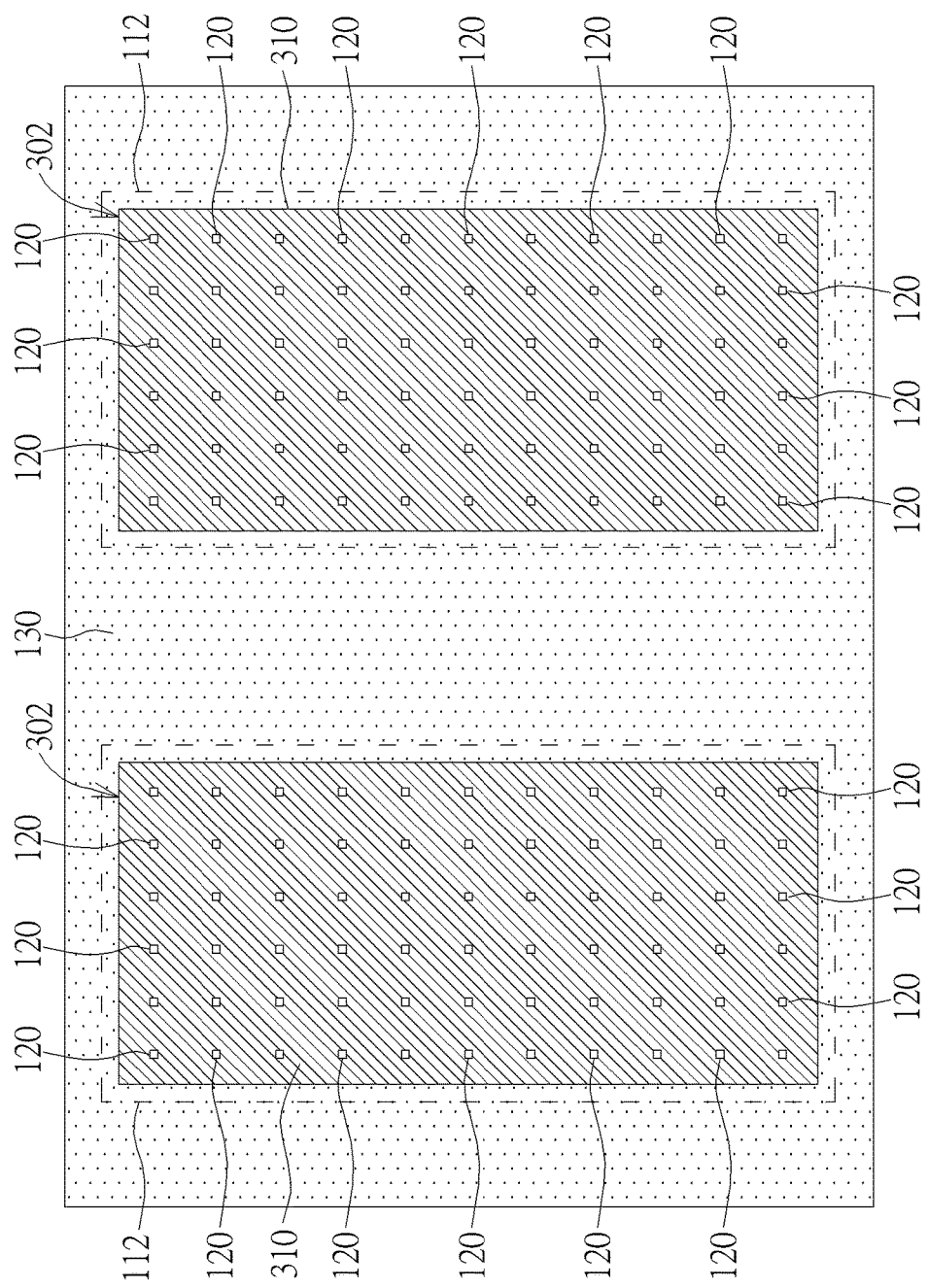
FIG. 12 is a planar view showing a different layout of the patterns of the dielectric material according to a fourth embodiment of the present invention.

FIG. 12 is a planar view showing a different layout of the patterns 302 of the dielectric material 310 according to a fourth embodiment of the present invention. In the embodiment, the metal contacts 120 are encapsulated by the patterns 302 before the molding compound 130 is formed.

According to the embodiments of the present invention, a pattern of the dielectric material is used as a stress relax pattern for releasing the stress concentrated on the surface of the die. The dielectric material has a lower coefficient of thermal expansion (CTE) and lower young's modulus than the mold compound. Therefore, the warpage of the die can be suppressed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device package, the semiconductor device package comprising:
   a die;
   a plurality of metal contacts electrically connected to the die;
   a continuous pattern of dielectric material formed on an active surface of the die, the continuous pattern of dielectric material forming contours of at least one opening, each of the at least one opening surrounding at least one of the metal contacts electrically connected to the die;
   a mold compound formed around the pattern, the die and the metal contacts, wherein at least a space between the metal contacts and the pattern is filled with the mold compound; and
   a redistribution layer, formed on a grinded surface of the mold compound, and electrically connected to the metal contacts;
   the method comprising:
   disposing the die on a carrier;
   forming the pattern of dielectric material on the active surface of the die to surround the plurality of metal contacts electrically connected to the die;
   forming the mold compound around the die, the metal contacts and the pattern, wherein the dielectric material has a young's modulus lower than a young's modulus of the mold compound, and the dielectric material has a coefficient of thermal expansion lower than a coefficient of thermal expansion of the mold compound;

grinding the mold compound to expose the metal contacts;

removing the carrier; and forming the redistribution layer on the grinded surface of the mold compound to electrically connect the metal contacts.

2. The method of claim 1, wherein the pattern is formed to have a single opening, and all of the metal contacts are formed within the single opening.

3. The method of claim 1, wherein the pattern is formed to have a first opening and a second opening, a first portion of the plurality of metal contacts are formed within the first opening, and a second portion of the plurality of metal contacts are formed within the second opening.

4. The method of claim 1, wherein the pattern is formed to have a plurality of more than one openings, each of the metal contacts is formed within one of the openings in a one to one correspondence.

5. The method of claim 1, wherein at least a space between the metal contacts and the pattern is filled with the mold compound.

6. The method of claim 1, further comprising forming the metal contacts on the die.

7. The method of claim 1, wherein the young's modulus of the dielectric material is between 0.01 GPa and 5 GPa.

8. The method of claim 1, wherein the dielectric material is epoxy resin, silicon resin, or polyimide resin.

9. The method of claim 1, wherein the dielectric material is a b-stage adhesive.

10. The method of claim 1, further comprising sawing the mold compound and the wiring layer.

11. A semiconductor device package, comprising:

a die;

a plurality of metal contacts electrically connected to the die;

a continuous pattern of dielectric material formed on an active surface of the die, the continuous pattern of dielectric material forming contours of at least one opening, each of the at least one opening surrounding at least one of the metal contacts electrically connected to the die;

a mold compound formed around the pattern, the die and the metal contacts, wherein at least a space between the metal contacts and the pattern is filled with the mold compound; and a redistribution layer, formed on a grinded surface of the mold compound, and electrically connected to the metal contacts;

wherein the dielectric material has a young's modulus lower than a young's modulus of the mold compound, and the dielectric material has a coefficient of thermal expansion lower than a coefficient of thermal expansion of the mold compound.

12. The semiconductor device package of claim 11, wherein the pattern comprises a single opening, and all of the metal contacts are formed within the single opening.

13. The semiconductor device package of claim 11, wherein the pattern comprises a first opening and a second opening, a first portion of the plurality of metal contacts are formed within the first opening, and a second portion of the plurality of metal contacts are formed within the second opening.

14. The semiconductor device package of claim 11, wherein the pattern comprises a plurality of more than one openings, and each of the metal contacts is formed within one of the openings in a one to one correspondence.

15. The semiconductor device package of claim 11, wherein the young's modulus of the dielectric material is between 0.01 GPa and 5 GPa.

16. The semiconductor device package of claim 11, wherein the dielectric material is epoxy resin, silicon resin, or polyimide resin.

17. The semiconductor device package of claim 11, wherein the dielectric material is a b-stage adhesive.

18. The semiconductor device package of claim 13, wherein more of the plurality of metal contacts are formed within the first opening than are formed within the second opening.

* * * * *